THERMOELECTRIC ELEMENTS HAVING GRADED ENERGY GAP

Filed July 6, 1960 2 Sheets-Sheet 1

INVENTOR.
FRED D. ROSI
BY
W. S. Hill
AGENT

INVENTOR.
FRED D. ROSI
BY W. S. Hill
AGENT

United States Patent Office 3,050,574

Patented Aug. 21, 1962

3,050,574

THERMOELECTRIC ELEMENTS HAVING GRADED ENERGY GAP

Fred D. Rosi, Plainsboro, N.J., assignor to Radio Corporation of America, a corporation of Delaware Filed July 6, 1960, Ser. No. 41,158
14 Claims. (Cl. 136—5)

This invention relates to improved thermoelectric devices. More particularly, this invention relates to improved thermoelectric devices comprising one or more junctions between thermoelements of different compositions.

When two rods or wires of dissimilar thermoelectric composition have their ends joined to form a continuous loop, two thermoelectric junctions are established between the respective ends so joined. If the two junctions are maintained at different temperatures, an electromotive force will be set up in the circuit thus formed. This effect is called the thermoelectric or Seebeck effect, and the device is known as a thermocouple. The Seebeck effect is utilized in many practical applications, such as the thermocouple thermometer. In this device, one junction of a thermocouple is maintained at a constant temperature, while the other junction is the temperature sensing element in thermal equilibrium with the temperature to be measured. Since the electromotive force produced by the thermocouple is a function of the temperature difference between the two junctions, the temperature of the second junction may be read by connecting a calibrated galvanometer in series with the circuit. The Seebeck effect is also utilized to transform heat energy directly into electrical energy.

A related phenomenon known as the Peltier effect has been utilized in environmental heating and cooling. This phenomennon is observed as the generation of heat at one junction and the absorption of heat at the other junction when an electric current is passed through the thermoelectric circuit described above.

Since good thermoelectric materials are semiconductors, they may be classed as N-type or P-type, depending on whether they donate or accept electrons in a circuit. The conductivity type of thermo electric materials may be controlled by adding appropriate acceptor or donor impurity substances. Whether a particular material is N-type or P-type may be determined by noting the direction of current flow across a junction formed by a circuit member or thermoelement of the particular thermoelectric material and another thermoelement of complementary material when operated as a thermoelectric generator according to the Seebeck effect. The direction of the positive (conventional) current at the cold junction will be from the P-type toward the N-type thermoelectric material. When the thermoelectric material which is in question and another element of complementary material form a cold junction according to the Peltier effect, the electromotive force is impressed to cause the current directions to be opposite those just described. The present invention is not restricted as to conductivity type of the novel materials used.

There are three fundamental requirements for desirable thermoelectric materials. The first requirement is the development of a high electromotive force per degree difference in temperature between junctions in a circuit containing two thermoelectric junctions. This quality is referred to as Q or the thermoelectric power of the material, and may be defined as $$\frac{d\theta}{dT}$$

where $d\theta$ is the potential difference induced by a temperature difference $dT$ between two ends of an element made of the material. The thermoelectric power of a material may also be considered as the energy relative to the Fermi level transmitted by a charge carrier along the material per degree temperature difference. The second requirement is a low thermal conductivity, since it would be difficult to maintain either high or low temperatures at a junction of a thermoelement if the material conducted heat too readily. The third requisite for a good thermoelectric material is high electrical conductivity, or, conversely stated, low electrical resistivity. This requisite is apparent since the temperature difference between two junctions will not be great if the current passing through the circuit generates excessive Joulean heat.

A quantitative approximation of the quality of a thermoelectric material may be made by relating the above three factors in an approximate figure of merit Z, which is usually defined as $$Z=\frac{Q^2}{pK}$$

where Q is the thermoelectric power, $p$ is the electrical resistivity, and K is the thermal conductivity. The validity of this figure of merit as the indication of usefulness of materials in practical applications is well established. Thus, as an objective, high thermoelectric power, low electrical resistivity and low thermal conductivity are desired. These objectives are difficult to attain because materials which are good conductors of electricity are usually good conductors of heat. Since the electrical and thermal conductivities of metallic materials are related according to the Wiedemann-Franz-Lorenz rule that the absolute temperature times the ratio of electrical conductivity to heat conductivity is a constant equal to about $5\times10^7$, this objective becomes the provision of a material with maximum ratio of electrical to thermal conductivities and a high thermoelectric power.

The thermal conductivity K may be considered as the sum of one component due to lattice heat conduction and another component due to heat conduction by charge carriers (electrons). In metals, the thermal conductivity component due to electron conduction is larger than the component due to phonons, which are quanta of energy associated with atomic lattice vibrations. In non-degenerate semiconductors the thermal conductivity component due to lattice phonons is larger than the component due to thermal conductivity by charge carriers. It is believed that the thermal conductivity component due to heat conduction by charge carriers cannot be reduced. However, it is possible to reduce K by substitutionally alloying into the semiconductor lattice another component which crystallizes in a similar lattice and has approximately the same lattice constant. It is theorized that the substitutional alloying introduces strains into the crystal lattice, which lowers the mean free path of phonons without, at the same time, scattering electrons which have longer wavelengths than the phonons. Hence, the lattice thermal conductivity is decreased by alloying without changing the thermoelectric power for a given resistivity in extrinsic material where impurity scattering is predominant.

An object of this invention is to provide improved thermoelectric elements having higher figures of merit.

Another object of this invention is to provide improved thermoelements having decreased thermal conductivity.

Still another object of this invention is to provide improved thermoelectric devices capable of efficient operation at elevated temperatures for the direct conversion of heat into electrical energy.

These and other objects of the invention are accomplished by providing an improved thermoelectric element comprising two circuit members of thermoelectrically complementary materials which are conductively joined to form a thermoelectric junction, with at least one of the two circuit members prepared so as to have a graded energy gap. Preferably, the energy gap of the graded circuit member is graded continuously from high at the hot junction end to low at the opposite end. According to one embodiment of the invention, the concentration of the conductivity type-determining impurity substance in the conductive member is also graded in the same direction as the energy gap, so that the electrical resistivity of the member is constant along its length. According to another embodiment of the invention, for improved performance, both of the circuit members are prepared with an energy gap which is graded from high at the hot thermoelectric junction end to low at the opposite end.

The invention will be described in greater detail with reference to the accompanying drawing, in which.

Figure 1:
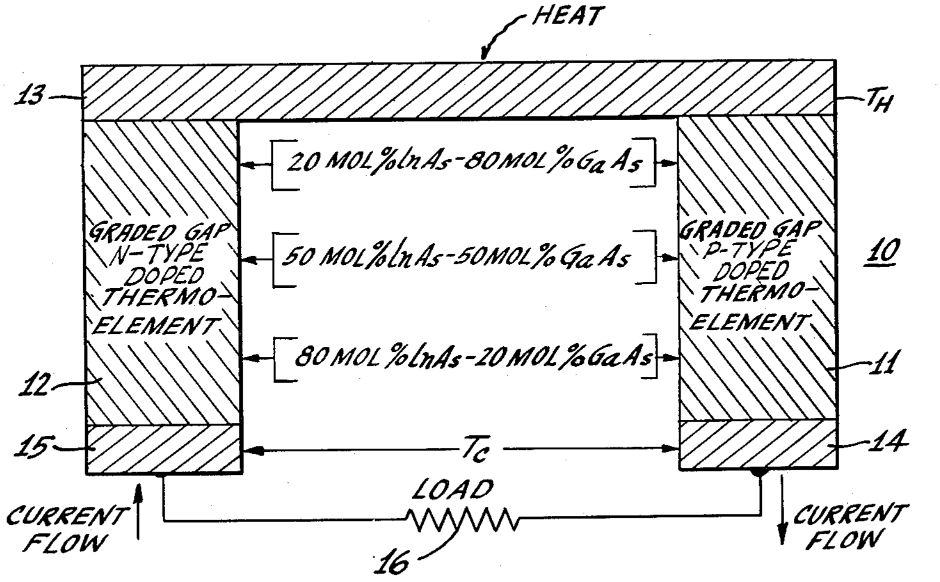
FIGURE 1 is a schematic cross-sectional elevational view of a thermoelectric device including two thermoelements according to the invention.

A thermoelectric device, according to the invention, for the efficient conversion of thermal energy directly into electrical energy is illustrated in FIGURE 1. The device 10 comprises two different circuit members of thermoelements 11 and 12 which are conductively joined at one end, hereinafter denoted the hot junction end, by means of an intermediate member 13. The intermediate member 13 may be in the form of a buss bar or a plate, and is made of a material which is thermally and electrically conductive, and has negligible thermoelectric power. Metals and alloys are suitable materials for this purpose. In this example, intermediate member 13 consists of a copper plate. The circuit members or thermoelements 11 and 12 terminate at the end opposite the thermoelectric junction in electrical contacts 14 and 15 respectively. In this example, contacts 14 and 15 are copper plates.

As indicated above, it has been found that improved efficiency is obtained in devices of this type by preparing at least one of the two circuit members 11 and 12 with a graded energy gap. In this example, both thermoelements 11 and 12 have been prepared so that the energy gap of each thermoelement is graded continuously from high at the thermoelectric junction end, that is, the end adjacent end 13, to low at the opposite end, which is the end adjacent contacts 14 or 15. Since the two thermoelements in such a device are preferably of opposite conductivity type, the circuit members 11 and 12 are made of thermoelectrically complementary materials. In this example, thermoelement 11 is a P-type semiconductor, while thermoelement 12 is an N-type semiconductor.

In the operation of the device 10, the metal plate 13 is heated to a temperature $T_H$ and becomes the hot junction of the device. The metal contacts 14 and 15 on each thermoelement are maintained at a temperature $T_C$ which is lower than the temperature of the hot junction of the device. The lower or cold junction temperature $T_C$ may, for example, be room temperature. A temperature gradient is thus established in each circuit member 11 and 12 from high adjacent plate 13 to low adjacent contacts 14 and 15, respectively. The electromotive force developed under these conditions produces in the external circuit a flow of (conventional) current in the direction shown by arrows in the drawing, that is, from the P-type thermoelement 11 toward the N-type thermoelement 12. The device is utilized by connecting a load, shown as a resistance 16 in the drawing, between the contacts 14 and 15 of thermoelements 11 and 12, respectively.

Figure 2:
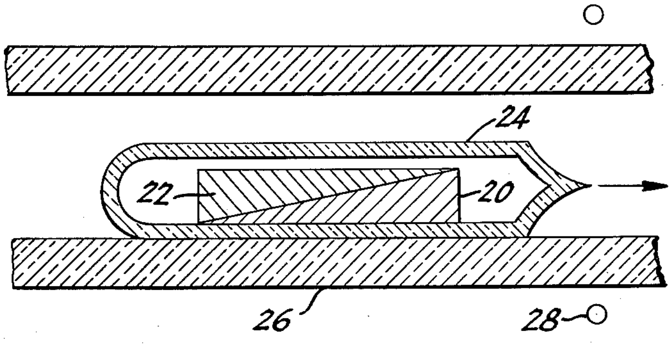
FIGURE 2 is a schematic cross-sectional view of a method of preparing a thermoelement with a graded energy gap; and, FIGURE 3 is a graph showing the variation of lattice thermal conductivity with composition in one thermoelectric element according to the invention.

One method of preparing a thermoelement with a graded energy gap is illustrated in FIGURE 2. Two wedge-shaped crystalline bodies 20 and 22 are juxtapositioned in a refractory ampule 24 so that the thin portion of one body is adjacent the thick portion of the other body. Bodies 20 and 22 are thermoelectric semiconductive materials of the same conductivity type, but are made of two different semiconductors. The two semiconductors are preferably selected so as to be miscible with each other in all proportions. One example of such a miscible pair of semiconductors is germanium and silicon. Another example of such a semiconductor pair is indium arsenide and gallium arsenide. Still another example of such a semiconductor pair is indium phosphide and gallium phosphide. In this example, the thermoelectric body 20 is composed of indium arsenide, while the body 22 is composed of gallium arsenide. Ampule 24 is sealed, then placed in a tubular furnace 26, and pulled slowly past a heating element 28. In this manner a narrow molten zone is formed in the semiconductor bodies, and the molten zone is made to traverse the length of the two semiconductor bodies 20 and 22, thus uniting them into a single ingot. In any pair of different semiconductors, one semiconductor will have an energy gap higher than the other. In this example, since the energy gap of gallium arsenide is 1.35 electron volts, while the energy gap of indium arsenide is only .35 electron volt, it will be seen that the energy gap of the ingot thus formed will be graded substantially continuously from a high value at one end, where the ingot is more than half of the material with the greater energy gap, namely gallium arsenide, to low at the other end, where the ingot is less than half gallium arsenide. If desired, a conductivity type-determining substance may be introduced into the resulting ingot during said operation. This may be accomplished by placing a number of pills of the desired impurity material along the length of the two semiconductor bodies before they are united into a single ingot. Suitable P-type impurities for indium arsenide and gallium arsenide are acceptors such as zinc and cadmium, while suitable N-type impurities are donors such as selenium and tellurium. By increasing the number of impurity pills near one end of the two semiconductor bodies, the concentration of the conductivity type-determining impurity substance in the resulting ingot may also be graded from high at one end to low at the other end. Preferably, the impurity concentration in the ingot is graded from high at the high energy gap end of the ingot to low at the low energy gap end of the ingot. The ends of the completed ingot are removed, leaving a bar of thermoelectric material which consists of about 20 mol percent indium arsenide and about 80 mol percent gallium arsenide at one end, which becomes the high energy gap end, and varies continuously to about 80 mol percent indium arsenide and about 20 mol percent gallium arsenide at the other end. The energy gap at the high gap end of the ingot is about 1.03 electron volts, while the energy gap at the low energy gap end is about 0.5 electron volt.

The resulting ingot may be considered as either an alloy or a solid solution of gallium arsenide and indium arsenide. The thermal conductivity of the resulting ingot is unusually low for such high energy gap material. This low thermal conductivity is believed to result from low lattice conductivity due to lattice strains which occur in the solid solution. The variation of lattice thermal conductivity with composition in the indium arsenide-gallium arsenide system is plotted in FIGURE 3. It will be seen that the lowest values of thermal conductivity lie in the range from 80 mol percent indium arsenide—20 mol percent gallium arsenide to 20 mol percent indium arsenide—80 mol percent gallium arsenide.

The highest efficiency which can be obtained for a thermoelectric generator operating with a hot junction at a temperature $T_H$ and a cold junction at a temperature $T_C$ is given by the equation $$\eta_{opt}=\frac{T_H-T_C}{T_H}\frac{\sqrt{1+\frac{T_H+T_C}{2}Z}-1}{\sqrt{1+\frac{T_H+T_C}{2}Z}+\frac{T_C}{T_H}}$$

where $\eta_{opt}$ is the maximum efficiency. The first term in this expression $$\frac{T_H-T_C}{T_H}$$

represents the theoretical maximum efficiency available from a reversible heat engine operating with heat input at temperature $T_H$ and heat exhaust at temperature $T_C$. In the second term of the equation, Z is equal to $$\frac{Q^2}{pK}$$

where Q is the thermoelectric power of the material, $p$ is the electrical resistivity, and K is the thermal conductivity of the material. As in all heat engines, it is desirable that the temperature difference $T_H-T_C$ between input and exhaust be as high as possible. The second term always has a value less than unity, and represents the amount by which the theoretical Carnot efficiency is decreased by losses due to the thermal conductivity K and the resistivity $p$ of the material.

An important advantage of the instant invention is that the high energy gap (1.03 electron volts) of the thermoelements 11 and 12 in the region adjacent the hot junction 13 permits operation of the device with a hot junction temperature at least as high as 1000° K. As previously indicated, a high temperature at the hot junction gives a large temperature difference between junctions and hence a high Carnot efficiency. With an average figure of merit for thermoelements of about 1 to $1.5\times10^3$ deg. $^{-1}$, and a temperature range from 1000° K. for the hot junction to 300° K. for the cold junction, a power generating efficiency of about 12% to 15% can be expected.

Another advantage of the invention is that the grading of the energy gap in thermoelements 11 and 12 from high at the hot junction to low at the cold junction permits the use of an alloy composition with a better figure of merit in the low temperature regions of the thermoelements than if the thermoelement composition was uniformly that of the hot end of the thermoelement.

Figure 3:
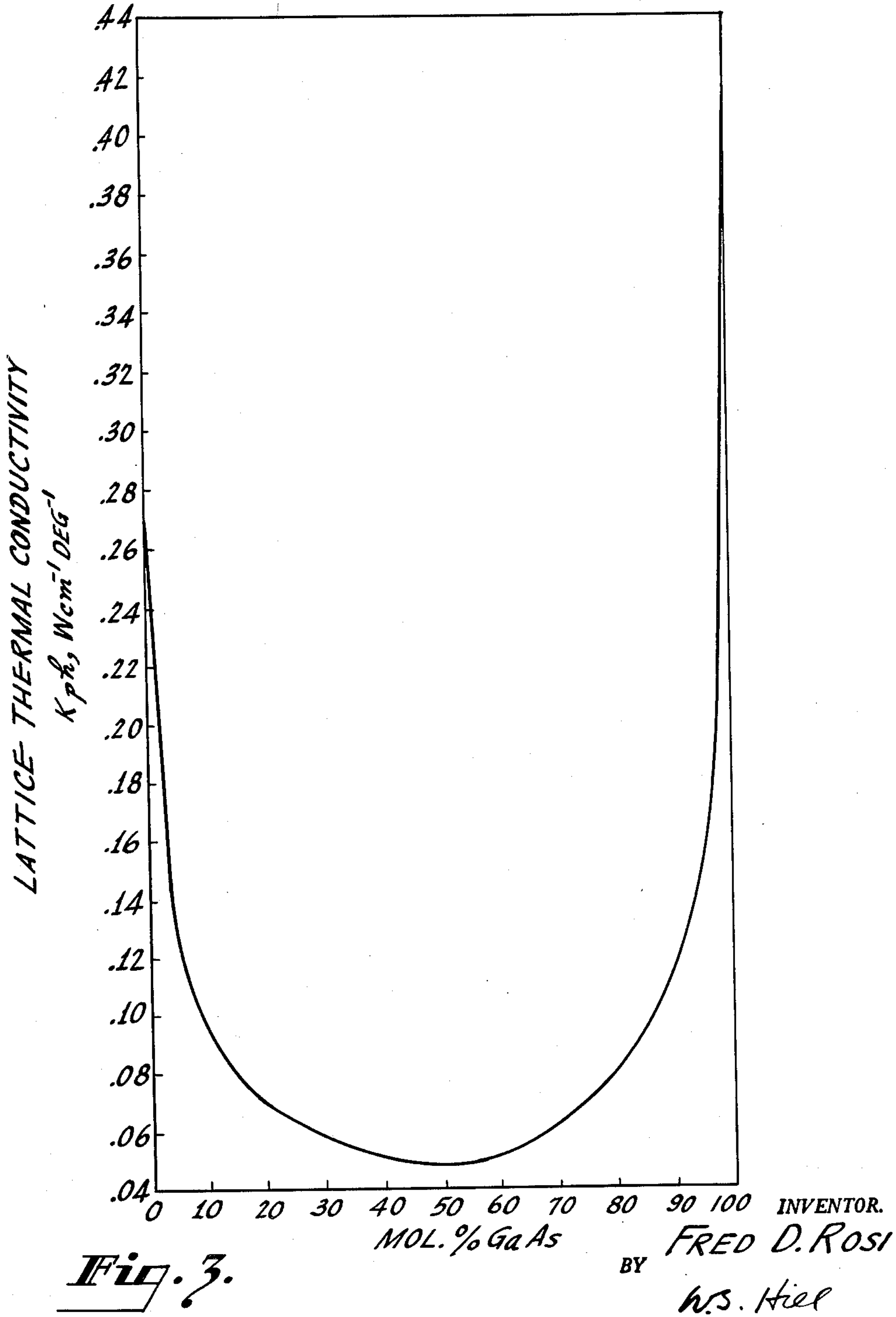

These two advantages are obtained with low thermal conductivity, since the alloy composition along the length of the two thermoelements 11 and 12 is all within the low lattice conductivity range, as indicated by the broad minimum in FIGURE 3 for the lattice conductivity of indium arsenide-gallium arsenide compositions containing from about 20 mol percent to 80 mol percent gallium arsenide.

When the impurity concentration in the thermoelements 11 and 12 is also graded from high at the hot junction end to low at the cold junction end, the figure of merit Z of each thermoelement 11 and 12 becomes more constant along its length. Such constant figure of merit is advantageous in order to obtain the optimum figure of merit for each temperature along the thermoelement. Stated alternatively, the figure of merit Z of the thermoelement thus becomes higher at the hot end that it would be if the impurity concentration were not graded.

Although the invention has been described with reference to an indium arsenide-gallium arsenide alloy of varying composition and hence of varying bandgap, it will be understood that this was by way of illustration only, and not as a limitation. The invention may be practiced with any pair of miscible thermoelectric semiconductive materials, provided the energy gap of one material is appreciably greater than the energy gap of the other material, and the composition of the thermoelement is graded from more than half of the greater energy gap material at one end, i.e., the hot end, to less than half of the greater energy gap material at the other end, i.e., the cold end. For example, suitable thermoelectric semiconductor pairs include the system germanium-silicon, gallium arsenide-gallium phosphide, aluminum arsenide-aluminum antimonide, as well as more complex systems such as the ternary semiconductors, for example the silver antimony telluride-silver antimony selenide system.

What is claimed is:

1. A thermoelectric generator comprising two circuit members of thermoelectrically opposite semiconductor materials, one said member being of P-type material and the other said member being of N-type material, said members being conductively joined to form a thermoelectric junction, at least one of said two members having a varying composition such that its energy gap is graded from one end to the other.

2. A thermoelectric generator comprising two circuit members of thermoelectrically opposite semiconductor materials, one said member being of P-type material and the other said member being of N-type material, said members being conductively joined at one end to form a thermoelectric junction, at least one of said two members having an energy gap which is graded continuously from high at the hot junction end to low at the opposite end.

3. A thermoelectric generator comprising two circuit members of thermoelectrically opposite semiconductor materials, one said member being of P-type material and the other said member being of N-type material, said members being conductively joined at one end to form a thermoelectric junction, both of said two members having varying compositions such that their energy gaps are graded from one end to the other.

4. A thermoelectric generator comprising two circuit members of thermoelectrically opposite semiconductor materials, one said member being of P-type material and the other said member being of N-type material, said members being conductively joined at one end to form a thermoelectric junction, both of said two members having an energy gap which is graded continuously from high at the hot junction end to low at the opposite end.

5. A thermoelectric generator comprising two circuit members of thermoelectrically opposite semiconductor materials, one said member being of P-type material and the other said member being of N-type material, said members being conductively joined at one end to form a thermoelectric junction, at least one of said two members consisting essentially of an alloy of indium arsenide and gallium arsenide, the composition of said alloy member being graded continuously from more than half gallium arsenide at the hot junction end of said member to less than half gallium arsenide at the opposite end of said member.

6. A thermoelectric generator comprising two circuit members of thermoelectrically opposite semiconductor materials, one said member being of P-type material and the other said member being of N-type material, said members being conductively joined at one end to form a thermoelectric junction, both of said two members consisting of an alloy of indium arsenide and gallium arsenide, the composition of each said alloy member being graded continuously from more than half gallium arsenide at the hot junction end of said member to less than half gallium arsenide at the opposite end of said member.

7. A thermoelectric generator comprising two circuit members of thermoelectrically opposite semiconductor materials, one said member being of P-type material and the other said member being of N-type material, said members being conductively joined at one end to form a thermoelectric junction, at least one of said two members consisting of an alloy of indium arsenide and gallium arsenide, the composition of said alloy member being graded continuously from about 80 mol percent gallium arsenide at the hot junction end of said member to about 20 mol percent gallium arsenide at the opposite end of said member.

8. A thermoelectric generator comprising two circuit members of thermoelectrically opposite semiconductor materials, one said member being of P-type material and the other said member being of N-type material, said members being conductively joined at one end to form a thermoelectric junction, both of said two members consisting of an alloy of indium arsenide and gallium arsenide, the composition of said alloy member being graded continuously from about 80 mol percent gallium arsenide at the hot junction end of said member to about 20 mol percent gallium arsenide at the opposite end of said member.

9. A thermoelectric generator comprising two circuit members of thermoelectrically opposite semiconductor materials, one said member being of P-type material and the other said member being of N-type material, said members being conductively joined at one end to form a thermoelectric junction, at least one of said two members consisting of an alloy of two semiconductive materials, the energy gap of one said material being greater than the energy gap of the other material, the composition of said member being graded continuously from more than half said greater energy gap material at the hot junction end of said member to less than half said greater energy gap material at the opposite end of said member.

10. A thermoelectric generator comprising two circuit members of thermoelectrically opposite semiconductor materials, one said member being of P-type material and the other said member being of N-type material, said members being conductively joined at one end to form a thermoelectric junction, both of said two members consisting of an alloy of two semiconductive materials, the energy gap of one said material being greater than the energy gap of the other material, the composition of said member being graded continuously from more than half said greater energy gap material at the hot junction end of said member to less than half said greater energy gap material at the opposite end of said member.

11. A thermoelectric generator comprising two circuit members of thermoelectrically opposite semiconductor materials, one said member being of P-type material and the other said member being of N-type material, said members being conductively joined at one end to form a thermoelectric junction, at least one of said two members having a graded energy gap and a graded concentration of a conductivity type-determining impurity substance, the impurity concentration being graded in the same direction as the energy gap.

12. A thermoelectric generator comprising two circuit members of thermoelectrically opposite semiconductor materials, one said member being of P-type material and the other said member being of N-type material, said members being conductively joined at one end to form a thermoelectric junction, at least one of said two members consisting of an alloy of two semiconductive materials, the energy gap of one said material being greater than the energy gap of the other material, the composition of said member being graded continuously from more than half said greater energy gap material at the hot junction end of said member to less than half said greater energy gap material at the opposite end of said member, said member also containing a conductivity type-determining impurity substance whose concentration is graded in the same direction as the energy gap.

13. A thermoelectric generator comprising two circuit members of thermoelectrically opposite semiconductor materials, one said member being of P-type material and the other said member being of N-type material, said members being conductively joined at one end to form a thermoelectric junction, at least one of said two members having an energy gap which is graded continuously from high at the hot junction end of said member to low at the opposite end, the impurity concentration of said member being graded continuously in the same direction as the energy gap.

14. A thermoelectric generator comprising two circuit members of thermoelectrically opposite semiconductor materials, one said member being of P-type material and the other said member being of N-type material, said members being conductively joined at one end to form a thermoelectric junction, at least one of said two members consisting of an alloy of indium arsenide and gallium arsenide, the composition of said one member being graded continuously from more than half gallium arsenide at the hot junction end of said member to less than half gallium arsenide at the opposite end of said member, the impurity concentration of said one member being graded continuously in the same direction as the energy gap.

References Cited in the file of this patent

UNITED STATES PATENTS

| | | |
|---|---|---|
| 2,858,275 | Folberth | Oct. 28, 1958 |
| 2,921,973 | Heikes et al. | Jan. 19, 1960 |
| 2,961,475 | Sommers | Nov. 22, 1960 |